(12) United States Patent
Takahashi et al.

(10) Patent No.: US 12,175,037 B2
(45) Date of Patent: *Dec. 24, 2024

(54) DISPLAY DEVICE

(71) Applicant: Japan Display Inc., Tokyo (JP)

(72) Inventors: Hideyuki Takahashi, Tokyo (JP); Hiroshi Tabatake, Tokyo (JP); Sho Yanagisawa, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/534,745

(22) Filed: Dec. 11, 2023

(65) Prior Publication Data

US 2024/0103662 A1    Mar. 28, 2024

Related U.S. Application Data

(63) Continuation of application No. 18/123,383, filed on Mar. 20, 2023, now Pat. No. 11,874,993.

(30) Foreign Application Priority Data

Mar. 25, 2022 (JP) ................................. 2022-049865

(51) Int. Cl.
*G06F 3/041* (2006.01)
*H10K 59/131* (2023.01)
*H10K 59/80* (2023.01)
*G06F 3/044* (2006.01)

(52) U.S. Cl.
CPC ........ *G06F 3/04164* (2019.05); *G06F 3/0412* (2013.01); *H10K 59/131* (2023.02); *H10K 59/873* (2023.02); *G06F 3/0446* (2019.05)

(58) Field of Classification Search
CPC .... G06F 3/0412; G06F 3/04164; G06F 3/044; G06F 3/045; G06F 3/0446; H10K 59/131; H10K 59/40; H10K 59/873; H10K 50/841; H10K 50/844; H10K 59/122; H10K 59/124; H10K 59/8731
See application file for complete search history.

(56) References Cited

U.S. PATENT DOCUMENTS

2022/0013746 A1*   1/2022   Joo ...................... H10K 59/131

* cited by examiner

*Primary Examiner* — Nelson M Rosario
(74) *Attorney, Agent, or Firm* — XSENSUS LLP

(57) ABSTRACT

Provided is a display device including a first dam surrounding the display area, a second dam surrounding the first dam, a first sensor electrode and a second sensor electrode overlapping the display area, a first sensor wiring and a second sensor wiring over the first dam and electrically connected to the first sensor electrode and the second sensor electrode, respectively, a first wiring under the second dam and electrically connected to the first sensor wiring at a first contact portion, and a second wiring under the second dam and electrically connected to the second sensor wiring at a second contact portion.

11 Claims, 14 Drawing Sheets

DISPLAY DEVICE

CROSS-REFERENCE TO RELATED APPLICATIONS

This application is a continuation of Ser. No. 18/123,383, filed Mar. 20, 2023, which claims the benefit of priority to Japanese Patent Application No. 2022-049865 filed on Mar. 25, 2022, the entire contents of each are incorporated herein by reference.

FIELD

An embodiment of the present invention relates to a display device.

BACKGROUND

A display device employing an on-cell type touch sensor is known as one type of display device to which flexible printed substrates are bonded (Japanese laid-open patent publication No. 2019-74709). An electrode used for a touch sensor is formed on a sealing layer of the touch sensor, and a wiring for transmitting a signal from the electrode to a flexible printed substrate is formed on the display device.

SUMMARY

A display device according to an embodiment of the present invention includes a display area, a first dam surrounding the display area, a second dam surrounding the display area and having cut surfaces at both ends, a first sensor electrode and a second sensor electrode overlapping the display area, a first sensor wiring over the first dam and electrically connected to the first sensor electrode, a second sensor wiring over the first dam and electrically connected to the second sensor electrode, a first wiring under the second dam and electrically connected to the first sensor wiring at a first contact portion, and a second wiring under the second dam and electrically connected to the second sensor wiring at a second contact portion. The first contact portion and the second contact portion are located between the first dam and the second dam. The second dam has an overlap with the first wiring at a first overlap portion. The second dam has an overlap with the second wiring at a second overlap portion. The second dam has a concave portion concaving toward the display area between the first overlap portion and the second overlap portion in a plan view.

A display device according to an embodiment of the present invention includes a display area, a first dam surrounding the display area, a second dam surrounding the display area and having cut surfaces at both ends, a first sensor electrode and a second sensor electrode overlapping the display area, a first sensor wiring over the first dam and electrically connected to the first sensor electrode, a second sensor wiring over the first dam and electrically connected to the second sensor electrode, a first wiring under the second dam and electrically connected to the first sensor wiring at a first contact portion, and a second wiring under the second dam and electrically connected to the second sensor wiring at a second contact portion. The first contact portion and the second contact portion are located between the first dam and the second dam. The second dam has an overlap with the first wiring at a first overlap portion. The second dam has an overlap with the second wiring at a second overlap portion. The second dam has a concave portion concaving toward the display area between the first overlap portion and the second overlap portion in a plan view.

DESCRIPTION OF EMBODIMENTS

Figure 1:
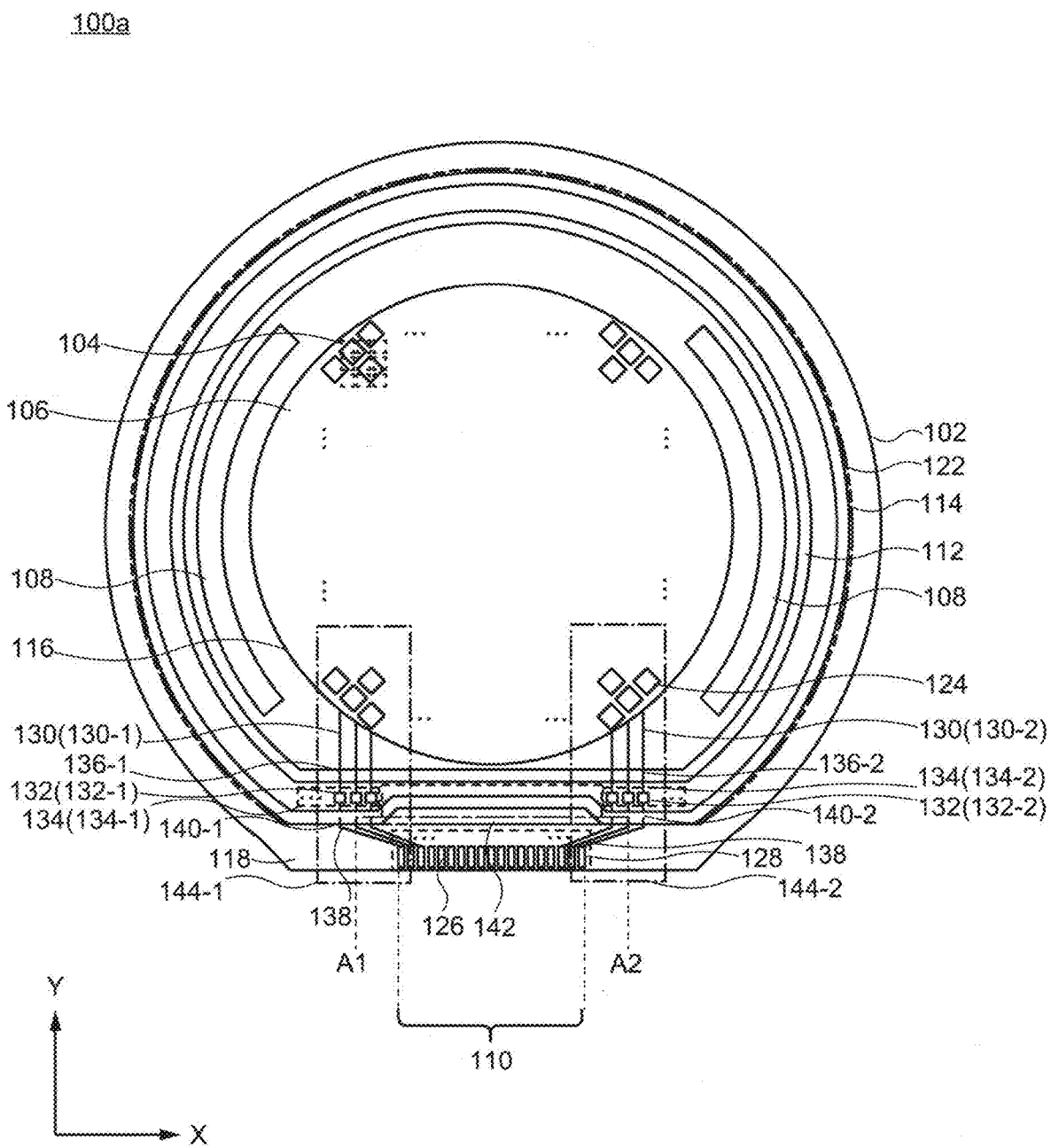
FIG. 1 is a schematic top view of a display device according to an embodiment of the present invention.

In a display device that employs a touch sensor implemented with an external driving circuit such as a flexible printed substrate, a mounting pad for mounting an external driving circuit needs to be installed in a surrounding area surrounding a display area. In addition, a wiring needs to be used to connect a mounting portion to an electrode used for the touch sensor. These installations may broadly occupy the surrounding area.

An object of an embodiment of the present invention is to provide a display device having a novel configuration. In addition, the narrowing of a frame of a display device is one of the issues.

Hereinafter, each embodiment of the present invention will be described with reference to the drawings and the like. However, the present invention can be implemented in various aspects without departing from the gist thereof, and is not to be construed as being limited to the description of the embodiments exemplified below.

In the drawings, although the widths, thicknesses, shapes, and the like of the respective portions may be schematically represented in comparison with the actual embodiments for clarity of explanation, the drawings are merely examples, and do not limit the interpretation of the present invention. In the present specification and the drawings, elements having the same functions as those described with respect to the above-described drawings are denoted by the same symbols, and redundant descriptions thereof may be omitted.

In this specification and claims, when expressing the manner of arranging another structure on a certain structure, the term "on" shall include both arranging another structure directly above a certain structure and arranging another structure over a certain structure via yet another structure, unless otherwise specified.

In this specification and claims, the phrase "a structure is exposed from another structure" means an aspect in which a part of a structure is not covered with another structure and includes an aspect that the portion not covered with this other structure is covered with yet another structure.

In the present specification and claims, the term "end view" refers to an object cut vertically and viewed from the side. The end view shall include a view when viewed from the end. In addition, the term "plan view" indicates when the object is viewed from directly above. A top view or plan view shall include a diagram when viewed in a plan view.

First Embodiment

1. Overall Configuration

In the present embodiment, a configuration of a display device 100a according to an embodiment will be described. FIG. 1 is a schematic top view of a display device according to an embodiment.

As shown in FIG. 1, the display device 100a includes a substrate 102, and a plurality of pixels 104 and a touch sensor 106 are arranged on the substrate 102. Furthermore, a driving circuit 108, a mounting pad 110, a first dam 112, and a second dam 114 are arranged in the display device 100a.

The display device 100a includes a display area 116 and a surrounding area 118 surrounding the display area 116. The plurality of pixels 104 and the touch sensor 106 are arranged in the display area 116, and the driving circuit 108, the mounting pad 110, the first dam 112, and the second dam 114 are arranged in the surrounding area 118. Although omitted in FIG. 1, the display device 100a further includes a counter substrate 122 paired with the substrate 102 so as to overlap the display area 116 and the surrounding area 118, as illustrated by a dotted line in FIG. 2, which will be described later.

Structures such as the plurality of pixels 104 described above and a sensor electrode 124 can be arranged in the display area 116 and the surrounding area 118 on the substrate 102. As shown in FIG. 1, the outer shape of the substrate 102 may have an arc-shaped part. However, the outer shape of the substrate 102 may be a polygon or a rectangle. In this case, the outer shape of the substrate 102 is the outer shape of the display device 100a cut out from a single substrate when manufacturing a plurality of display devices 100a on a single substrate.

For example, the plurality of pixels 104 is arranged in a row direction (direction X) and a column direction (direction Y) in the display area 116. A light-emitting element (not shown) is arranged in each pixel 104 and electrically connected to a transistor arranged in each pixel 104. For example, an organic electro luminescence (EL) element can be arranged in the light-emitting element. The organic EL element may include a pair of electrodes serving as an anode and a cathode, an organic layer containing an organic EL material, and an insulating pixel defining layer (PDL) separating adjacent organic EL elements.

In addition, transistors (not shown) are arranged in each pixel 104. These transistors are electrically connected to the driving circuit 108 and supplied with a signal from the driving circuit 108.

The driving circuit 108 that supplies a signal to the pixel 104 may be arranged between the display area 116 and the first dam 112. Although FIG. 1 shows an example of an arrangement in which a plurality of driving circuits 108 sandwiches the display area 116, the preset embodiment is not limited to this arrangement.

The driving circuit 108 may be electrically connected to an external driving circuit via a wiring (not shown). The driving circuit 108 may drive the pixel 104 according to a signal supplied from the external driving circuit. A driving IC (Integrated Circuit) can be used in the external driving circuit. The driving IC can supply a signal to the driving circuit 108 via the mounting pad 110.

For example, a COF (Chip On Glass) can be used as the driving IC. In addition, for example, an FOG (Film On Glass) in which a wiring substrate is mounted on a plurality of terminals 126 for external connection using an anisotropic conductive film can be used as the mounting pad 110. When installing the COF in the mounting pad 110 using the FOG, the COF is installed by thermocompression bonding with the mounting pad 110 in a COF installation area 128 including the mounting pad 110 shown in FIG. 1.

As shown in FIG. 1, the touch sensor 106 can be composed of a plurality of sensor electrodes 124. Although the sensor electrode 124 shown in FIG. 1 is illustrated as a diamond having a diagonal in the direction X and the direction Y, the present embodiment is not limited to this shape.

A capacitive method, a resistance film method, or the like can be used as the touch sensor 106. In the case where the capacitive method is used for the touch sensor 106, for example, the plurality of sensor electrodes 124 may be arranged in a matrix in the display area 116, and each may be connected in the row direction or the column direction. The sensor electrode 124 connected in the row direction and the sensor electrode 124 connected in the column direction are separated. The sensor electrode connected in the row direction or column direction can serve as an electrode for transmitting or receiving signals, respectively. In addition, the sensor electrode 124 connected in the row direction or the column direction is electrically connected to the external driving circuit. One of the sensor electrodes 124 connected in the row direction or column direction may be supplied with a signal from the external driving circuit, and the other may supply the signal to the external driving circuit.

Similar to the external driving circuit for the pixel 104, the driving IC can be used as a driving circuit for driving the sensor electrode 124. The sensor electrode 124 is electrically connected to the driving IC via the mounting pad 110 that is electrically connected to a sensor wiring 130 (a sensor wiring 130-1 and a sensor wiring 130-2). The above-described FOG or COF can be used for the mounting pad 110 and the driving IC.

As shown in FIG. 1, the sensor wiring 130 and the mounting pad 110 are electrically connected by the sensor wiring 130 and a wiring 138 being directly or electrically connected at a contact 132 and the wiring 138 being directly or electrically connected to the mounting pad 110. Although not shown, the sensor wiring 130 is arranged from one side of the sensor electrode 124 connected in the row direction or column direction, respectively. As shown in FIG. 1, the sensor wiring 130 is directly or electrically connected to the wiring 138 at the contact 132 arranged on the left and right sides of the mounting pad 110 in a plan view. A plurality of contacts 132-1 arranged on the left of the mounting pad 110 and a plurality of contacts 132-2 arranged on the right of the mounting pad 110 are included in a contact portion 134-1 and a contact portion 134-2, respectively.

The contact portion 134-1 and the contact portion 134-2 are arranged between the first dam 112 surrounding the display area 116 and the second dam 114 surrounding the first dam and separated. In addition, the contact portion 134-1 and the contact portion 134-2 secure a space between the first dam 112 and the second dam 114 for contacting the sensor wiring 130 and the wiring 138.

The sensor wiring 130 electrically connected to the contact portion 134-1 overlaps the first dam 112 at an overlap portion 136-1 of the first dam 112 between the sensor electrode 124 and the contact portion 134-1. In addition, the sensor wiring 130 electrically connected to the contact portion 134-2 overlaps the first dam 112 at an overlap portion 136-2 of the first dam 112 between the sensor electrode 124 and the contact portion 134-2. Further, the wiring 138 electrically connected to the contact portion 134-1 overlaps the second dam 114 at an overlap portion 140-1 of the second dam 114 between the mounting pad 110 and the contact portion 134-1. In addition, the wiring 138 electrically connected to the contact portion 134-2 overlaps the second dam 114 at an overlap portion 140-2 of the second dam 114 between the mounting pad 110 and the contact portion 134-2.

As described above, although the first dam 112 and the second dam 114 overlap the wiring 138 and the sensor wiring 130 that are directly or electrically connected to the contact portion 134, they do not overlap the contact portion 134. The contact portion 134, the first dam 112, and the second dam 114 are arranged at a distance to secure a space for contacting the sensor wiring 130 and the wiring 138.

Further, the second dam 114 is arranged at a constant distance from the mounting pad 110. In addition, the second dam 114 is arranged at a constant distance from the COF installation area 128 for installing films or the like where the driving IC is mounted on the mounting pad 110. The constant distance may be any distance that has little effect on the second dam 114 due to thermocompression bonding when installing the COF or the like in the COF installation area 128. Specifically, the constant distance may be a distance that does not cause scorching of the second dam 114 due to the thermocompression bonding or breakage of the second dam 114.

In order to bring the above-described arrangement, the mounting pad 110, and the COF installation area 128 closer to the display area 116, the second dam 114 has a concave portion 142, which concaves toward the display area 116 in a plan view, between the overlap portion 140-1 and the overlap portion 140-2 of the second dam 114. The concave portion 142 of the second dam 114 is located between the first dam 112 and the mounting pad 110 and may be arranged between the contact portion 134-1 and the contact portion 134-2. As described above, the concave portion 142 of the second dam 114 is arranged at a constant distance from the contact portion 134-1, the contact portion 134-2, and the COF installation area 128.

The second dam 114 is arranged as described above at the periphery of the mounting pad 110 and the contact portion 134, and the outer shape of the second dam 114 may have an arc-shaped part as shown in FIG. 1.

The outer shape of the first dam 112 surrounded by the second dam 114 may also have an arc-shaped part. Although FIG. 1 shows an example in which the first dam 112 and the second dam 114 have an arcuate shape, they are not limited to this shape as long as they have a shape adapted to the outer shape of the display device 100*a*. Further, the counter substrate 122 is arranged so as to cover the inside of the substrate 102 from the second dam 114. The counter substrate 122 protects the structures on the substrate 102, such as the sensor electrode 124 and the like. As shown in FIG. 1, the outer shape of the counter substrate 122 may have a shape along the outer shape of the substrate 102. However, the counter substrate 122 is arranged away from the mounting pad 110 and the COF installation area 128, and is arranged at a position that does not hinder the mounting of the driving IC or the like.

2. Substructure 2-1. Substructure-1

Figure 2:
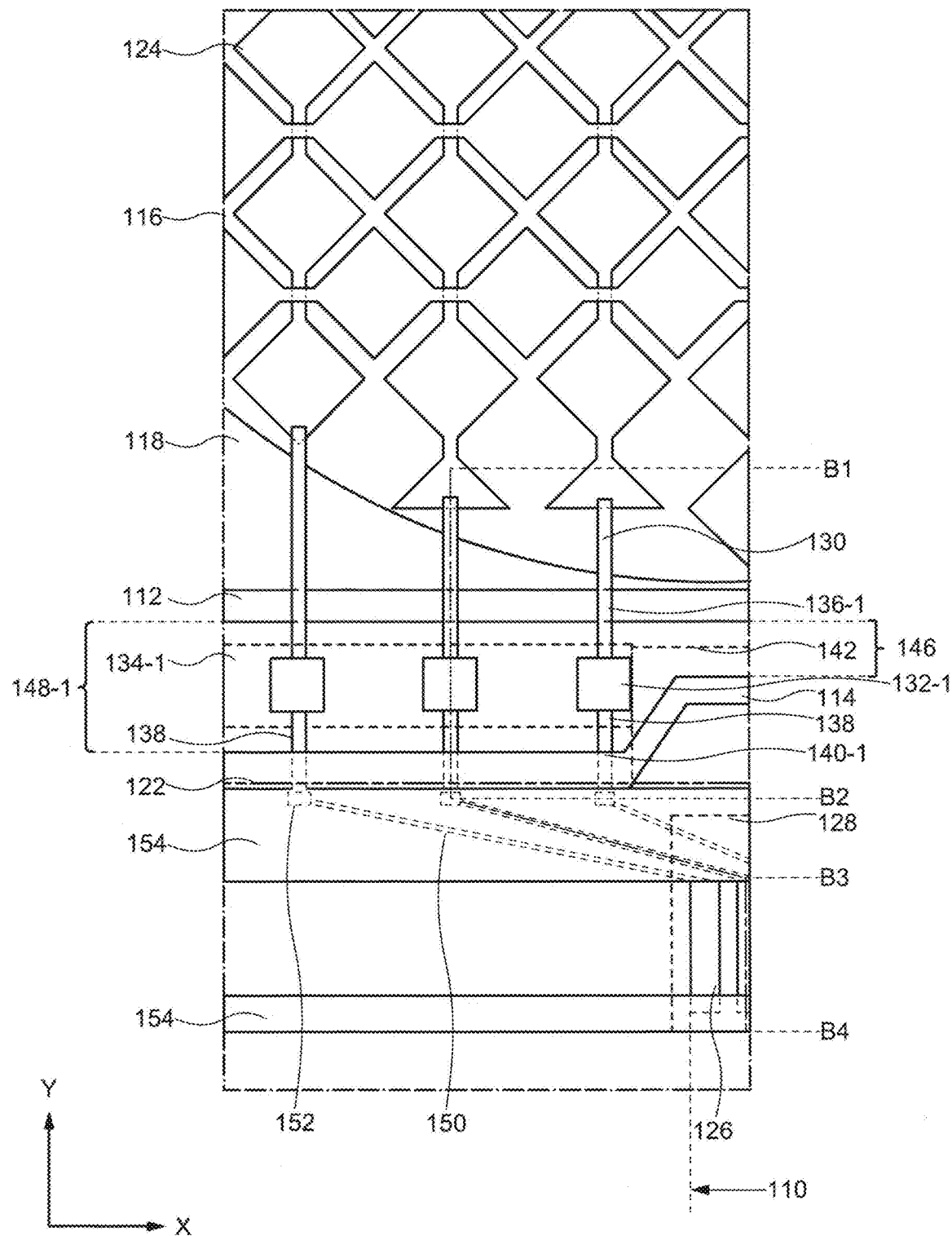
FIG. 2 is a schematic top view of a display device according to an embodiment of the present invention.
Figure 3:
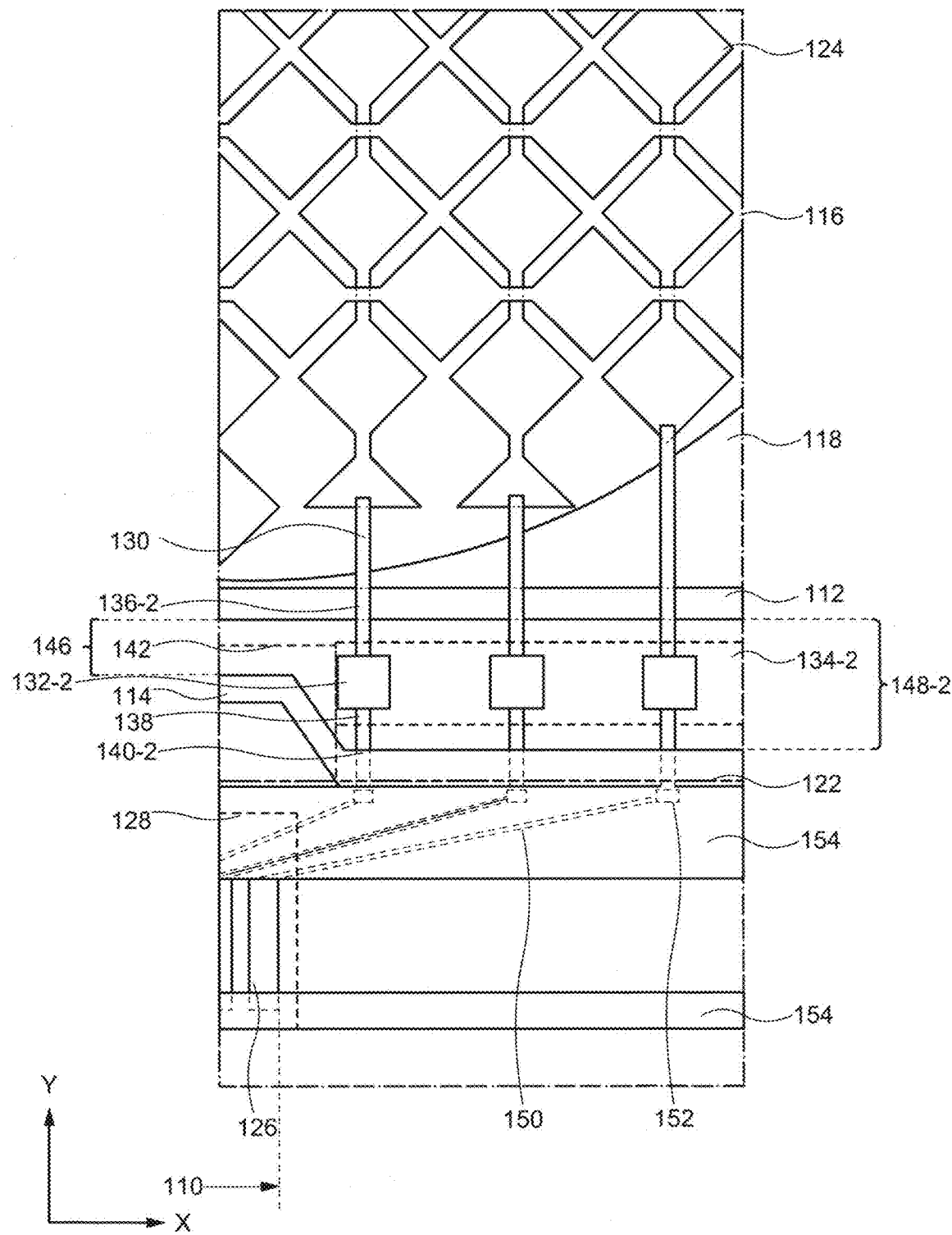
FIG. 3 is a schematic top view of a display device according to an embodiment of the present invention.

FIG. 2 shows a schematic top view of a substructure 144-1 of the display device 100*a* surrounded by a chain line shown in FIG. 1, and FIG. 3 shows a schematic top view of a substructure 144-2 of the display device 100*a* surrounded by the chain line shown in FIG. 1. Hereinafter, the same configuration as in FIG. 1 may be omitted.

As shown in FIG. 2, since the second dam 114 has the concave portion 142 towards the display area 116, a length 146 between the second dam 114 and the first dam in the concave portion 142 is shorter than a length 148-1 between the second dam and the first dam 112 in the contact portion 134-1.

Specifically, the length 146 between the first dam 112 and the second dam 114 shown in FIG. 2 is shorter than the length 148-1 between the overlap portion 136-1 of the first dam 112 and the overlap portion 140-1 of the second dam 114. In this case, the first dam 112 defining the length 146 is between the adjacent overlap portion 136-1 and the overlap portion 136-2. In addition, the second dam 114 defining the length 146 is between the adjacent overlap portion 140-1 and the overlap portion 140-2. In this case, the sensor wiring 130 overlapping the overlap portion 136-1 and the wiring 138 overlapping the overlap portion 140-1 are directly and/or electrically connected at the contact 132-1.

In addition, the length between the first dam 112 and the second dam 114 can be defined similarly in FIG. 3. As shown in FIG. 3, since the second dam 114 has the concave portion 142 toward the display area 116, the length 146 between the second dam 114 and the first dam 112 in the concave portion 142 is shorter than a length 148-2 between the second dam 114 and the first dam 112 in the contact portion 134-2.

Specifically, the length 146 between the first dam 112 and the second dam 114 shown in FIG. 3 is shorter than the length 148-2 between the overlap portion 136-2 of the first dam 112 and the overlap portion 140-2 of the second dam 114. In this case, the first dam 112 defining the length 146 as described above is between the adjacent overlap portion 136-1 and the overlap portion 136-2. In this case, the sensor wiring 130 overlapping the overlap portion 136-2 and the wiring 138 overlapping the overlap portion 140-2 are directly and/or electrically connected at the contact 132-2.

Further, as shown in FIG. 2, the wiring 138 having an overlap at the overlap portion 140-1 can be electrically connected to the terminal 126 mounted on the mounting pad 110 via a terminal wiring 150. In this case, the wiring 138 and the terminal wiring 150 may be directly and/or electrically connected at a contact 152. The terminal wiring 150 may be covered with an insulating film 154 between the contact 152 and the terminal 126.

In addition, as shown in FIG. 3, the wiring 138 having an overlap at the overlap portion 140-2 can be electrically connected to the terminal 126 mounted on the mounting pad 110 via the terminal wiring 150. In this case, the wiring 138 and the terminal wiring 150 may be directly and/or electrically connected at the contact 152. The terminal wiring 150 may be covered with the insulating film 154 between the contact 152 and the terminal 126.

2-2. Cross-Sectional Structure-1

Figure 4:
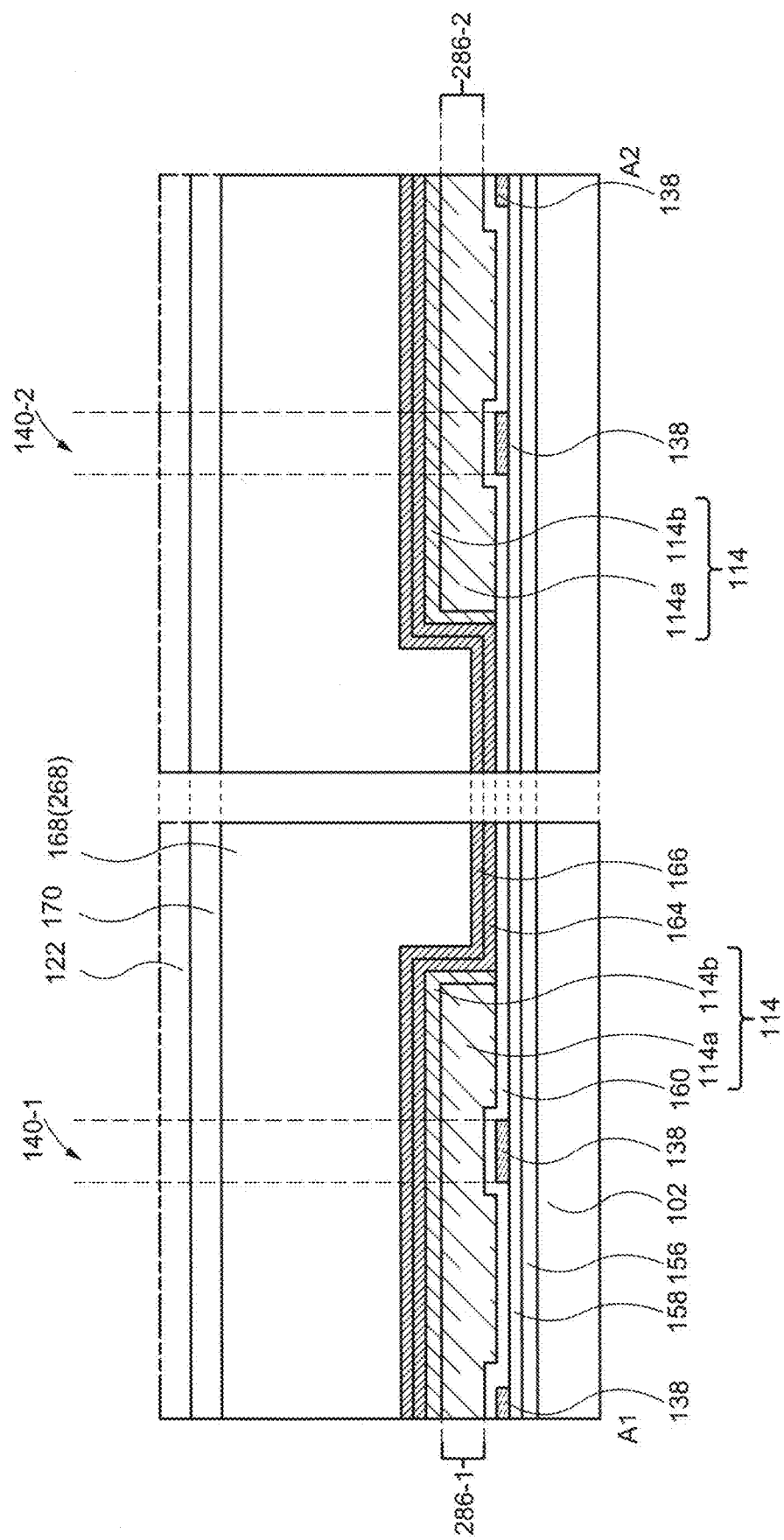
FIG. 4 is a schematic end view of a display device according to an embodiment of the present invention.

FIG. 4 shows a schematic end view along a chain line A1-A2 shown in FIG. 1.

As shown in FIG. 4, in the display device 100a, a base film 156 and an insulating film 158 are arranged on the substrate 102, and the wiring 138 is arranged on the insulating film 158. Further, an interlayer film 160 is arranged on the wiring 138 and the insulating film 158, and the second dam 114 is arranged on the interlayer film 160. In this case, the wiring 138 and the second dam 114 overlap at the overlap portion 140-1 and the overlap portion 140-2 of the second dam 114.

In the second dam 114, a second dam layer 114b is arranged on a second dam layer 114a so as to cover the second dam layer 114a. A protective film 164 is arranged on the second dam layer 114b, and a protective film 166 is arranged on the protective film 164. An overcoat layer 168 is further arranged on the protective film 166.

The counter substrate 122 may be arranged on the overcoat layer 168. As shown in FIG. 4, the counter substrate 122 may have an adhesive layer 170 on a surface facing the overcoat layer 168. Although FIG. 4 shows the structure of the second dam 114 surrounding the display area 116 and the structures around the structure, there is no restriction on the structures, and various structures can be used.

Although the second dam 114 is arranged to surround the first dam 112 without a break in FIG. 1, the second dam 114 is separated in a cross-section along a line such as A1-A2 shown in FIG. 4, which connects the overlap portion 140-1 and the overlap portion 140-2, because the second dam 114 has the concave portion 142 concaving toward the display area 116 at the periphery of the mounting pad 110.

2-3. Cross-Sectional Structure-2

Figure 5:
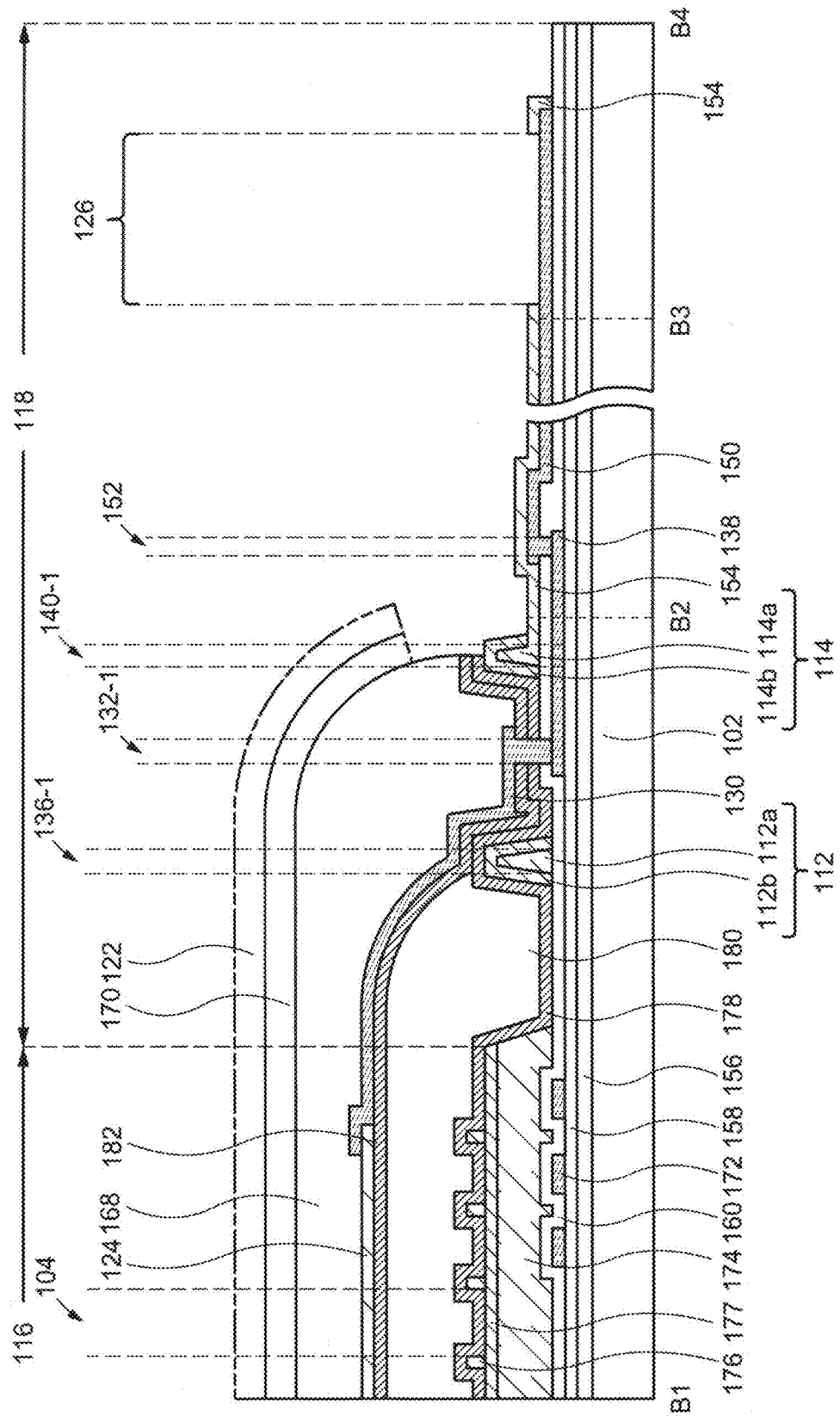
FIG. 5 is a schematic end view of a display device according to an embodiment of the present invention.

FIG. 5 shows a schematic end view along a chain line B1-B4 shown in FIG. 2. Hereinafter, an explanation of the same configuration as in FIG. 4 may be omitted.

The display device 100a has the substrate 102 as described above, and for example, a glass or quartz substrate, or an organic resin substrate can be used as the substrate 102. In the case of using an organic resin substrate, the substrate 102 may have flexibility.

As described above, the base film 156 may be arranged on the substrate 102. The base film 156 can prevent contamination from the substrate 102, and for example, an inorganic insulating material can be used. For example, silicon nitride, silicon oxide, and composites thereof can be used as the inorganic insulating material.

As described above, the insulating film 158 may be arranged on the base film 156. Although not shown, the insulating film 158 in the display area 116 may serve as a gate insulating film of the transistors included in the pixel 104 and the driving circuit 108. The same material as the base film 156 may be used for the insulating film 158.

A signal line 172 may be arranged on the insulating film 158 in the display area 116, and the wiring 138 may be arranged on the insulating film 158 in the surrounding area. A signal is supplied from the driving circuit 108 to each pixel 104 shown in FIG. 1 via the signal line 172. Alternatively, the signal line 172 may function as a power supply line that supplies a constant potential to the pixel 104. As described above, the wiring 138 may function as a wiring that transmits a signal between the external driving circuit and the touch sensor 106 shown in FIG. 1. For example, a material containing titanium, aluminum, copper, molybdenum, or the like as a main component can be used for the signal line 172 and the wiring 138, and these materials can be used in a single layer or a stacked layer.

The interlayer film 160 may be arranged so as to cover the signal line 172 and the wiring 138. The interlayer film 160 may also serve as a planarization film for the signal line 172 or the wiring 138. The same material for the base film 156 may be used for the interlayer film 160.

The terminal wiring 150 connected to the wiring 138 at the contact 152 may be arranged on the wiring 138 and the interlayer film 160. The same material for the signal line 172 and the wiring 138 may be used for the terminal wiring 150.

A planarization film 174 may be arranged on the interlayer film 160 and the signal line 172 in the display area 116. Further, the first dam 112 and the second dam 114 are arranged on the interlayer film 160 in the surrounding area 118. The second dam 114 is arranged on the interlayer film 160 so as to overlap the wiring 138. Further, the insulating film 154 contiguous with the second dam 114 may be arranged on the terminal wiring 150. The insulating film 154 may be formed at the same time as the second dam 114 and may be formed, for example, by halftone-exposing and etching a second dam layer 114a of the films forming the second dam 114.

In this case, the terminal wiring 150 arranged under the insulating film 154 has a portion exposed from the insulating film 154 in the COF installation area 128, which may be the terminal 126 of the mounting pad 110.

The same materials as the signal line 172 and the wiring 138 can be used for the terminal 126 and the terminal wiring 150. In addition, a material such as an acryl resin or an organic resin containing polysiloxane, polyimide, polyester, or the like can be used for the planarization film 174, a first dam layer 112a, the second dam layer 114a, and the insulating film 154.

Further, a spacer 176 and a pixel defining layer 177 may be arranged on the planarization film 174. The pixel defining layer 177 functions as a barrier that defines the pixel 104. In addition, the pixel defining layer 177 is arranged so as to cover the end portion of the electrode of the light-emitting element arranged in the pixel 104. The spacer 176 may be arranged on the pixel defining layer 177 and may have a function of supporting a fine mask used in a manufacturing process of the light-emitting element of the pixel 104, for example, a vapor deposition process. The pixel defining layer 177 may be formed by halftone exposure in the process of forming the spacer 176. In addition, in the same process as the process of forming the spacer 176, a second dam layer 112b and the second dam layer 114b can be formed on the first dam layer 112a and the second dam layer 114a, respectively. An organic resin material such as an epoxy resin or an acryl resin can be used for the spacer 176, the pixel defining layer 177, the second dam 112b layer, and the second dam layer 114b formed in these processes.

A first passivation film 178 is arranged on the spacer 176 and in an area surrounded by the first dam 112 and the second dam 114 in a plan view. The display area 116 is included in the area surrounded by the first dam 112 and the second dam 114, and if the organic EL element is used in the pixel 104, the first passivation film 178 can suppress impurities from entering the organic EL element. The first passivation film 178 may be formed in the same layer as the protective layer 164 formed on the second dam 114. For example, an inorganic compound such as silicon oxide or silicon nitride can be used for the first passivation film 178 and the protective film 164.

A cover layer 180 is arranged on the first passivation film 178 and in an area surrounded by the first dam 112 in a plan view. The cover layer 180 can planarize the pixel 104 and if the light-emitting element is arranged in the pixel 104, the light-emitting element can be protected from impurities. The same material as the insulating film 154 can be used for the cover layer 180.

A second passivation film 182 may be arranged on the cover layer 180 and in an area surrounded by the first dam 112 and the second dam 114 in a plan view. The second passivation film 182 may be formed in the same layer as the protective layer 166. Therefore, an inorganic compound such as silicon nitride can be used for the second passivation film 182.

A plurality of different types of films, such as the cover layer 180 and the second passivation film 182 described above, can planarize the pixel 104 and prevent impurities from entering the light-emitting element arranged on the pixel 104, so that a structure such as the touch sensor 106 and the like can be arranged on the pixel 104 in the display area 116.

The sensor electrode 124 may be arranged on the second passivation film 182 in the display area 116. Since the sensor electrode 124 is arranged in the display area 116, for example, a transparent conductive film of indium-tin oxide (ITO), indium-zinc oxide (IZO), and zinc oxide (ZnO) having conductivity, or a light transmittance oxide that can ensure visibility of a displayed image such as indium-tin-zinc oxide (ITZO) can be used for the sensor electrode 124.

In addition, the sensor wiring 130 connected to the sensor electrode 124 and the wiring 138 is arranged on the second passivation film 182. Since the second passivation film 182 is also arranged on the first dam 112, the sensor wiring 130 is also arranged on the first dam 112. The same material as the signal line 172 and the wiring 138 can be used for the sensor wiring 130.

Further, the overcoat layer 168 is arranged so as to cover the sensor electrode 124 and the sensor wiring 130. The overcoat layer 168 is arranged in an area surrounded by the second dam 114 in a plan view. The same material as the cover layer 180 can be used for the overcoat layer 168.

The counter substrate 122 may be arranged on the overcoat layer 168. In FIG. 5, although an example in which the counter substrate 122 is arranged so as to overlap the overcoat layer 168 is shown, it is sufficient that the counter substrate 122 may be arranged on a structure arranged on the substrate 102. A film, glass, or the like functioning as a polarization plate can be used as the counter substrate 122. In addition, the counter substrate 122 has a function of protecting a structure arranged on the substrate 102, for example, the pixel 104, the touch sensor 106, and the like. Further, when bonding the counter substrate 122 and the substrate 102, for example, an adhesive with a refractive index close to the material of the counter substrate 122, such as OCA (Optical Clear Adhesive), can be processed into a surface facing the structure on the substrate 102.

3. Modification of First Dam 3-1. Modification 1

Figure 6:
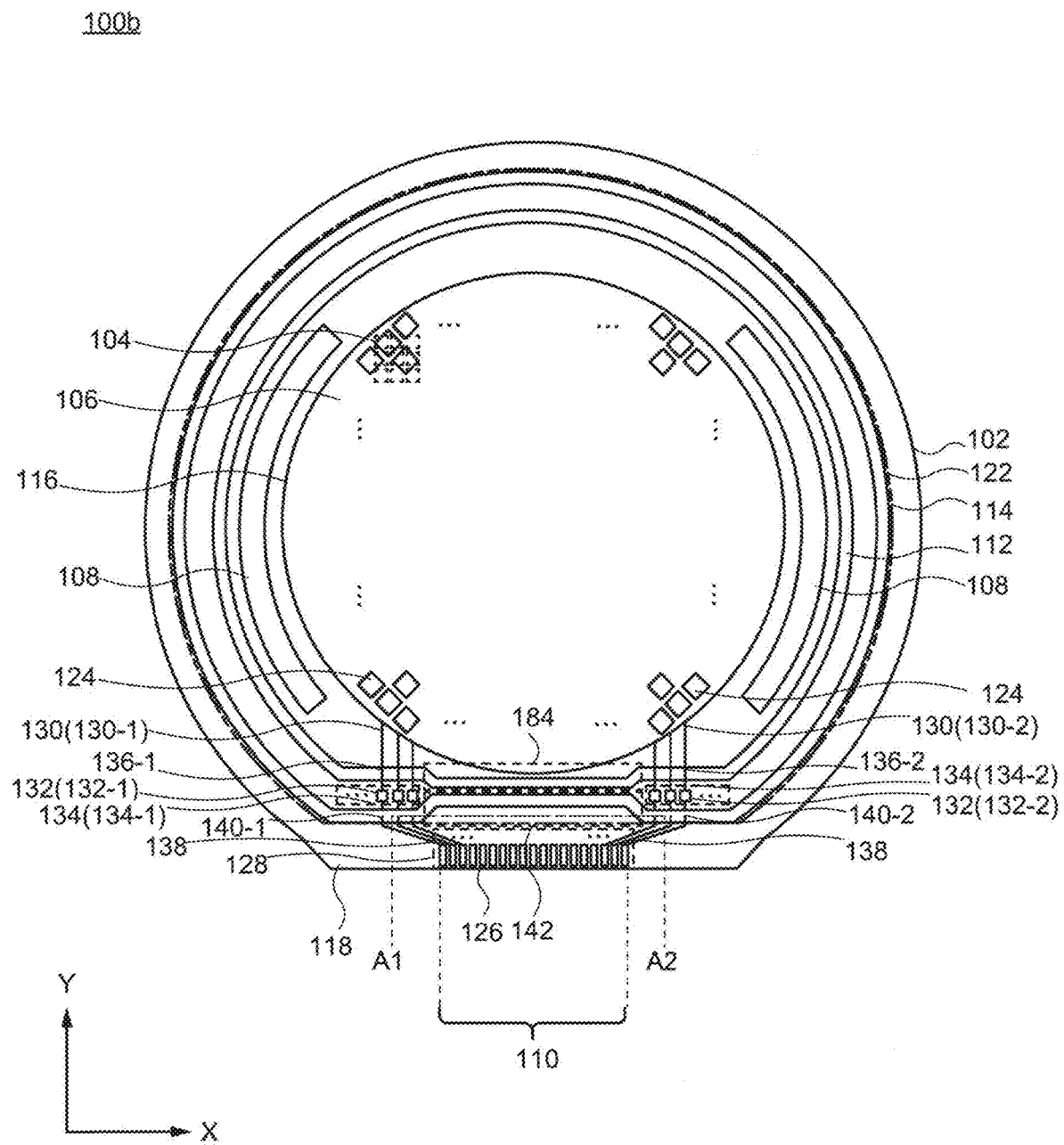
FIG. 6 is a schematic top view of a display device according to an embodiment of the present invention.

As shown in FIG. 6, the first dam 112 having a convex portion 184 can be arranged in a display device 100b. The first dam 112 may have the convex portion 184 protruding to the outer side of the substrate 102 at the periphery of the contact portion 134. The first dam 112 has a portion (the convex portion 184) that is convex toward the second dam 114 rather than the overlap portion 136-1 and the overlap portion 136-2 in a plan view between the overlap portion 136-1 and the overlap portion 136-2. In this case, the convex portion 184 of the first dam 112 is arranged opposite the concave portion 142 of the second dam 114. In addition, the convex portion 184 of the first dam 112 and the concave portion 142 of the second dam 114 are located between the contact portion 134-1 and the contact portion 134-2. Further, the convex portion 184 of the first dam 112 and the concave portion 142 of the second dam 114 are located between the mounting pad 110 and the display area 116.

3-2. Modification 2

Figure 7:
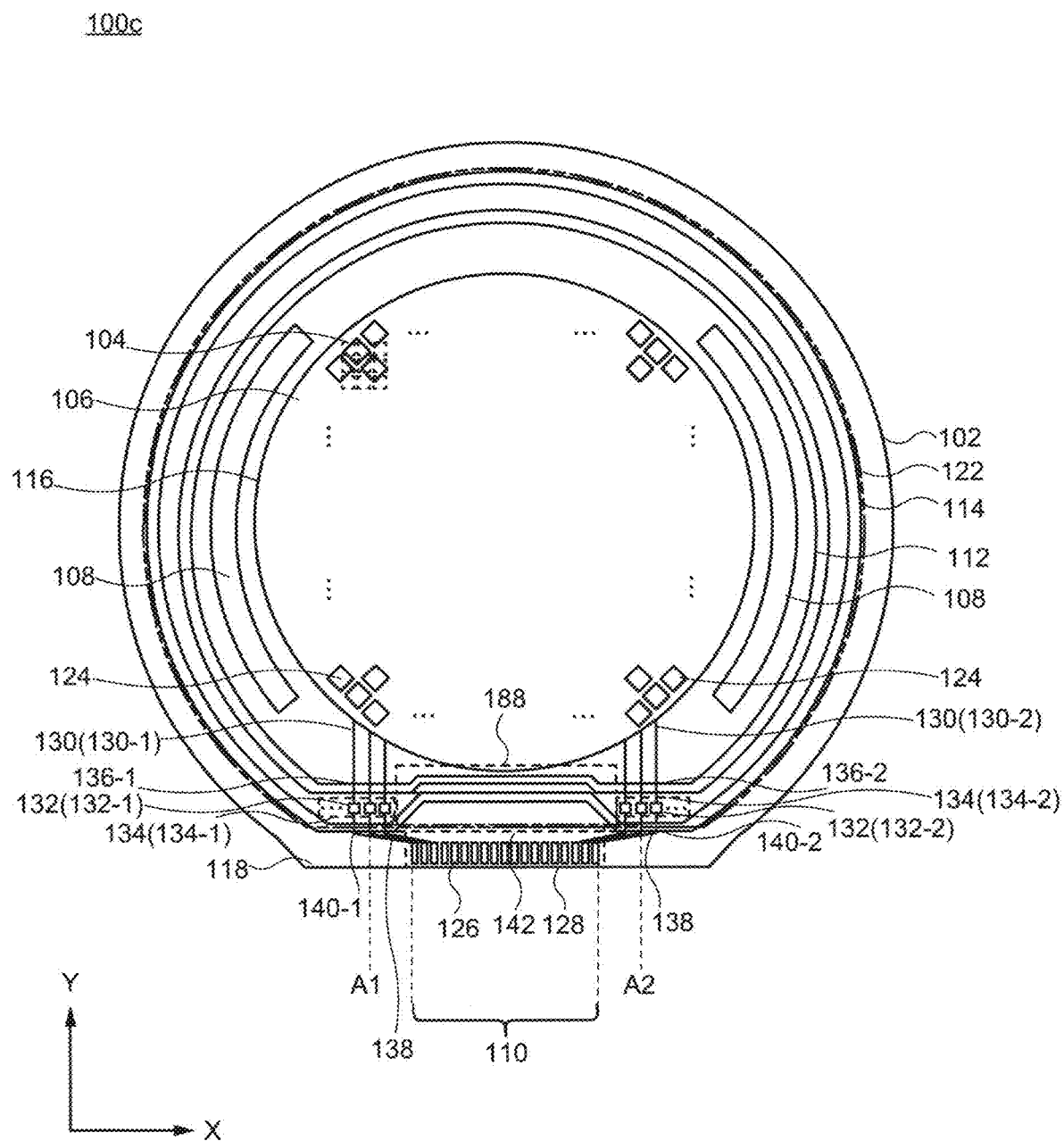
FIG. 7 is a schematic top view of a display device according to an embodiment of the present invention.

As shown in FIG. 7, the first dam 112 may have a concave portion 188 toward the display area 116 in an area sandwiched by the mounting pad 110 and the display area 116. In this case, if a display device 100c includes the plurality of contact portions 134 sandwiching the concave portion 142 of the second dam 114, it can be said that the first dam 112 has a convex portion toward the contact portion 134. In addition, as shown in FIG. 7, a plurality of sensor wirings 130 is connected to the contact portion 134, and the plurality of sensor wirings 130 overlap each other between the first dam 112 and the plurality of overlap portions 136. In other words, it can be said that the first dam 112 has a convex portion toward the second dam 114 in an area where the plurality of overlap portions 136 is located.

4. Modification of Product Outer Shape

In the following description, a modification of the outer shape of the substrate 102 is shown as the product outer shapes of a display device 100d and a display device 100e.

4-1. Modification 1

Figure 8:
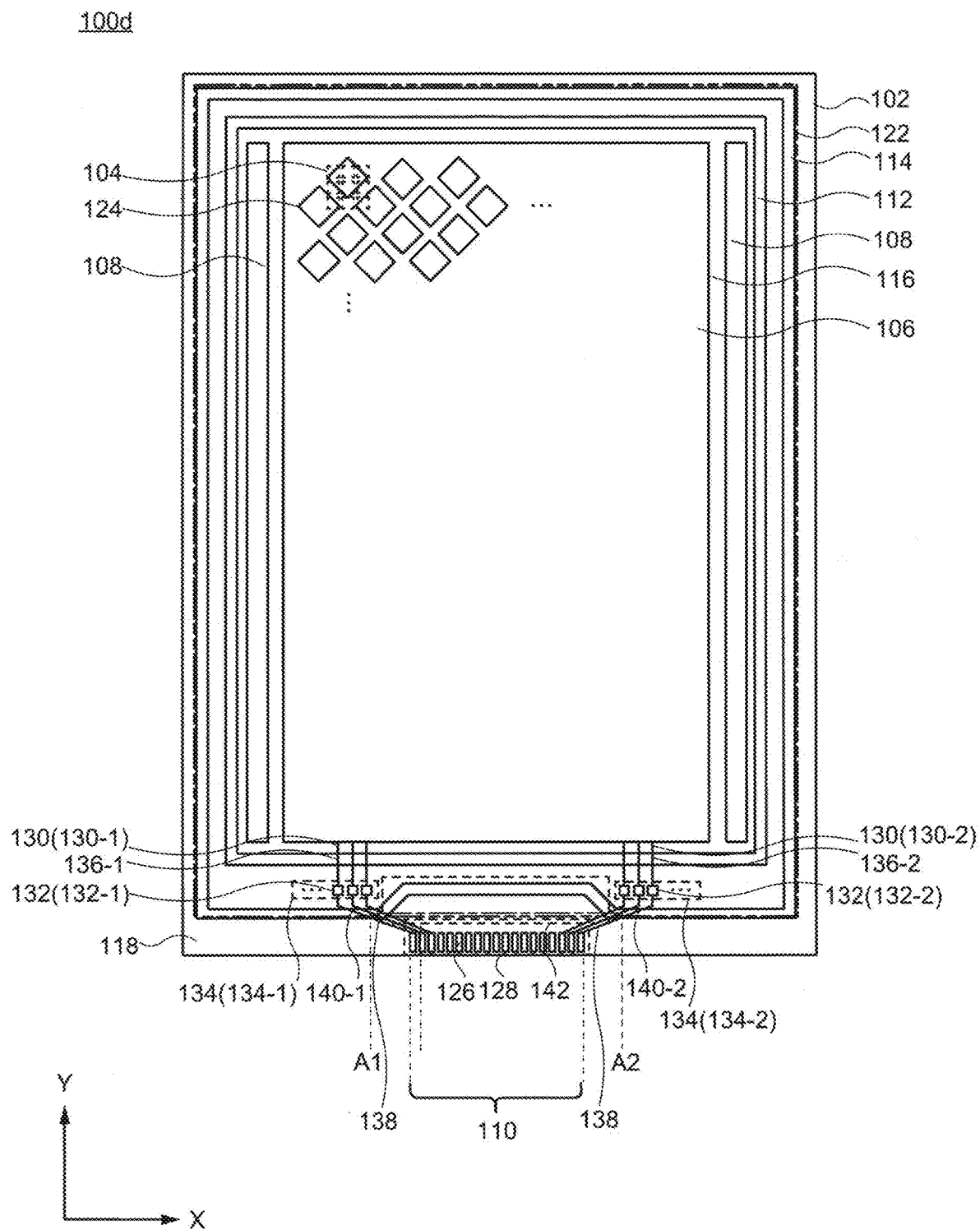
FIG. 8 is a schematic top view of a display device according to an embodiment of the present invention.

A polygonal substrate 102 can be arranged in the display device 100d. FIG. 8 shows an example in which a rectangular substrate 102 is arranged in the display device 100d. The first dam 112 and the second dam 114 have portions shaped along the outer shape of the substrate 102. Therefore, as shown in FIG. 8, when the substrate 102 is rectangular, the outer shape of the first dam 112 may be rectangular.

Figure 9:
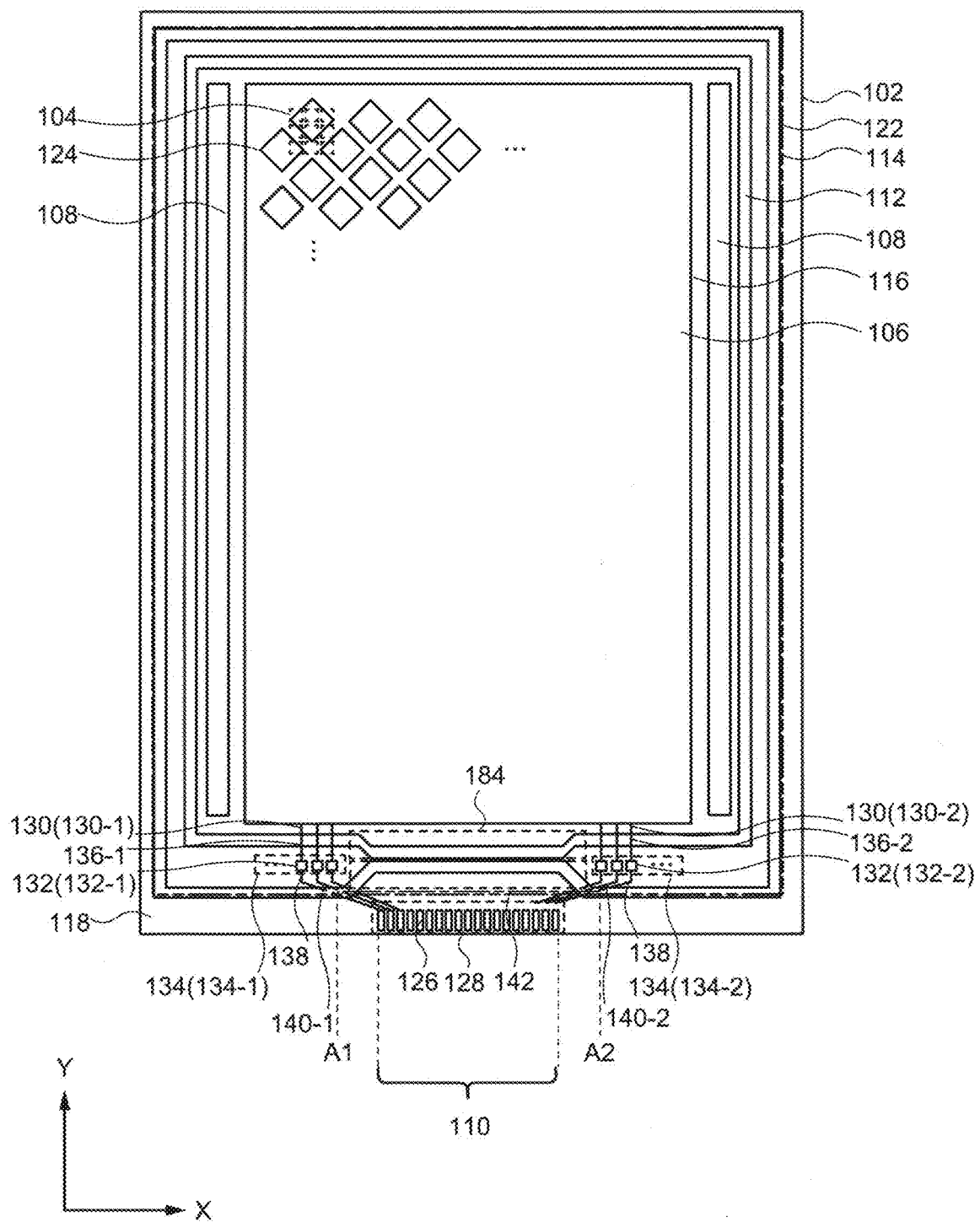
FIG. 9 is a schematic top view of a display device according to an embodiment of the present invention.

In addition, in the display device 100e, as shown in FIG. 9, the first dam 112 may have the convex portion 184 toward the second dam 114 between the display area 116 and the concave portion 142 of the second dam 114. In this case, the outer shape of the first dam 112 may have a shape adapted to the outer shape of the substrate 102 except for the convex portion 184.

Since the second dam 114 has the concave portion 142 toward the first dam 112 between the mounting pad 110 and the first dam 112 and between the contact portion 134-1 and the contact portion 134-2, except for the concave portion 142 it is possible to have a shape along the outer shape of the substrate 102.

Therefore, since the first dam 112 and the second dam 114 may have a shape along the outer shape of the substrate 102, they can be adapted to the substrate 102 having various shapes.

The display device 100 includes the display area 116, the first dam 112 surrounding the display area 116, the second dam 114 surrounding the first dam 112, and the mounting pad 110 connected to the external driving circuit for supplying a signal to the touch sensor 106 arranged in the display area 116, and the mounting pad 110 is arranged between the outer shape of the substrate 102 and the second dam 114. In this case, the second dam 114 has the concave portion 142 toward the first dam 112 between the mounting pad 110 and the first dam 112. Further, the second dam 114 has the concave portion 142 toward the first dam 112 between the contact portion 134-1 and the contact portion 134-2 located between the first dam 112 and the second dam 114. Since the second dam has the concave portion 142 arranged in this way, the mounting pad 110 can be arranged proximate to the display area 116 while ensuring a certain distance from the second dam 114, and the contact portion 134 can be arranged proximate to the display area 116 while maintaining a certain distance between the first dam 112 and the second dam 114.

Further, according to the present embodiment, the display area 116 can be made wider by the first dam 112 having the convex portion toward the second dam between the display area 116 and the concave portion of the second dam 114.

Therefore, applying the present embodiment makes it possible to arrange the structures such as the mounting pad 110 and the contact portion 134 efficiently in the surrounding area 118 of the display device 100e, the display area 116 can occupy a wide area on the substrate 102, and it is possible to provide the display device 100 with a narrowed frame.

Second Embodiment

In the present embodiment, a configuration of a display device 200 according to an embodiment of the present invention is shown. Descriptions of the same or similar configurations as those of the first embodiment may be omitted.

1. Overall Configuration

One of the differences between the display device 200 and the display device 100 of the first embodiment is that the display device 200 has the second dam having a portion surrounding the outer shape of the product or the outer shape of a substrate 202. Further, one of the differences between the display device 200 and the display device 100 of the first embodiment is that a second dam 214 has a cut surface 286 obtained by cutting the product of the display device 200 because the outer shape of the product or the outer shape of the substrate 202 is located between a first dam 212 and the second dam 214.

Figure 10:
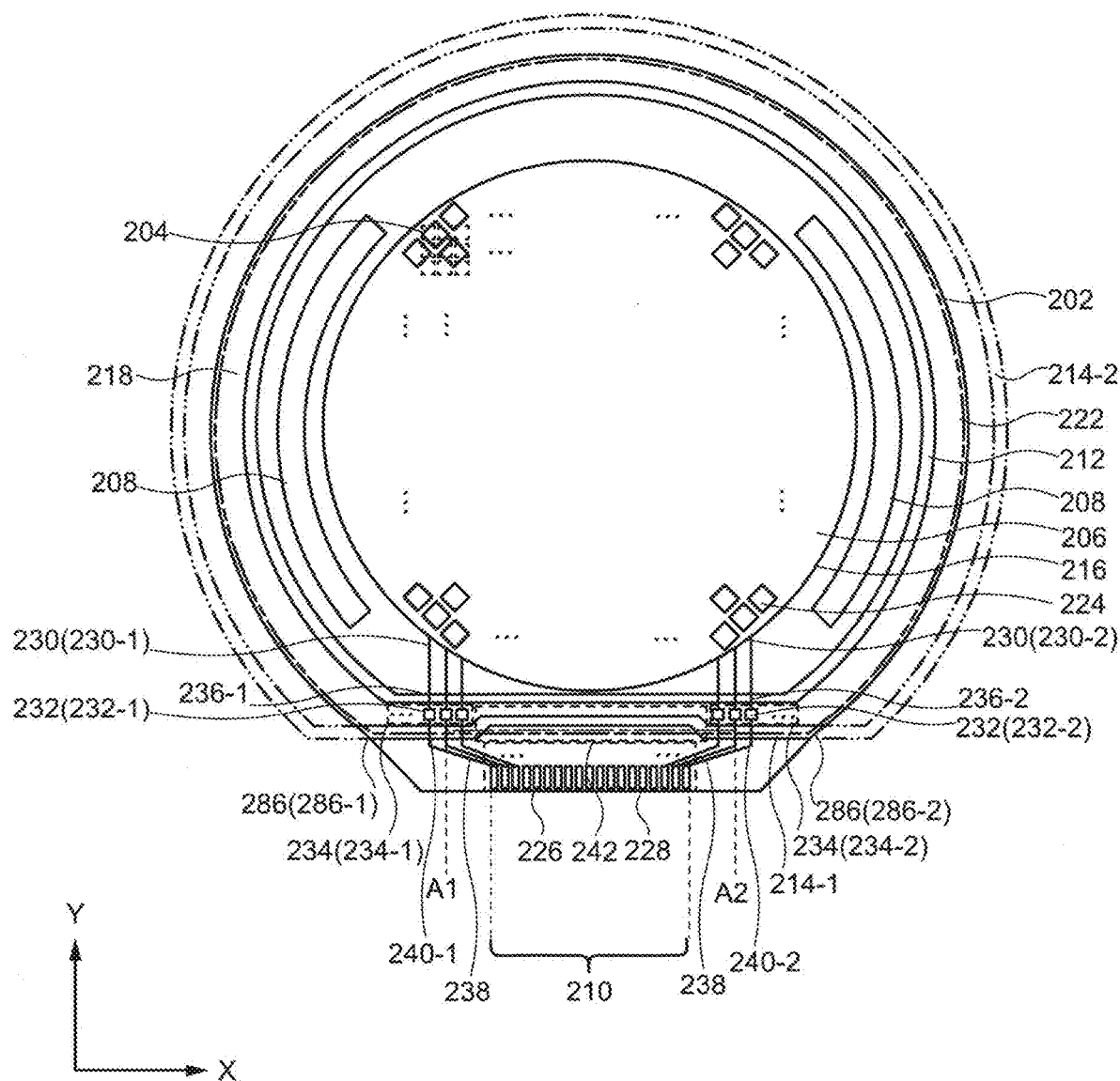
FIG. 10 is a schematic top view of a display device according to an embodiment of the present invention.

Specifically, the second dam 214 shown in FIG. 10 is composed of a second dam 214-1 and a second dam 214-2. The second dam 214-2 that is cut off by the product-cutting of the display device 200 is indicated by a two-dot chain line, and the second dam 214-1 remaining on the substrate 202 is indicated by a solid line.

As shown in FIG. 10, the second dam 214-1 is arranged between the outer shapes of the first dam 212 and the substrate 202, and the second dam 214-2 is arranged so as to sandwich the outer shapes of the first dam 212 and the substrate 202. That is, the outer shape of the substrate 202 is located between the first dam 212 and the second dam 214-2.

The second dam 214-1 is a range from a cut surface 286-1 on the substrate 202 to a cut surface 286-2, and the second dam 214-2 is the second dam except for this range. As a result, the second dam 214 including a concave portion 242 becomes the second dam 214-1. In addition, the concave portion 242 of the second dam 214 is located between the cut surface 286-1 and the cut surface 286-2.

As shown in FIG. 10, the second dam 214-1 is arranged between the mounting pad 210 and the first dam 212, and has the cut surfaces 286 at both ends thereof. In this case, the cut surface of the overcoat layer 268 and the cut surface 286 of the second dam 214 are the cut surface 286-1 along A1 shown in FIG. 4 and the cut surface 286-2 along A2 shown in FIG. 4. Therefore, the cut surface of the overcoat layer 268 arranged on a sensor electrode 224 and the second dam 214 and the cut surface 286 of the second dam 214 may be flush with each other. However, since the cut surfaces of the overcoat layer 268 and the second dam 214 are formed when the outer shape of the substrate 202 is cut, a state in which there is substantially no step between the cut surface of the overcoat layer 268 and the cut surface 286 of the second dam 214 is flush.

2. Modification of First Dam 2-1. Modification 1

Figure 11:
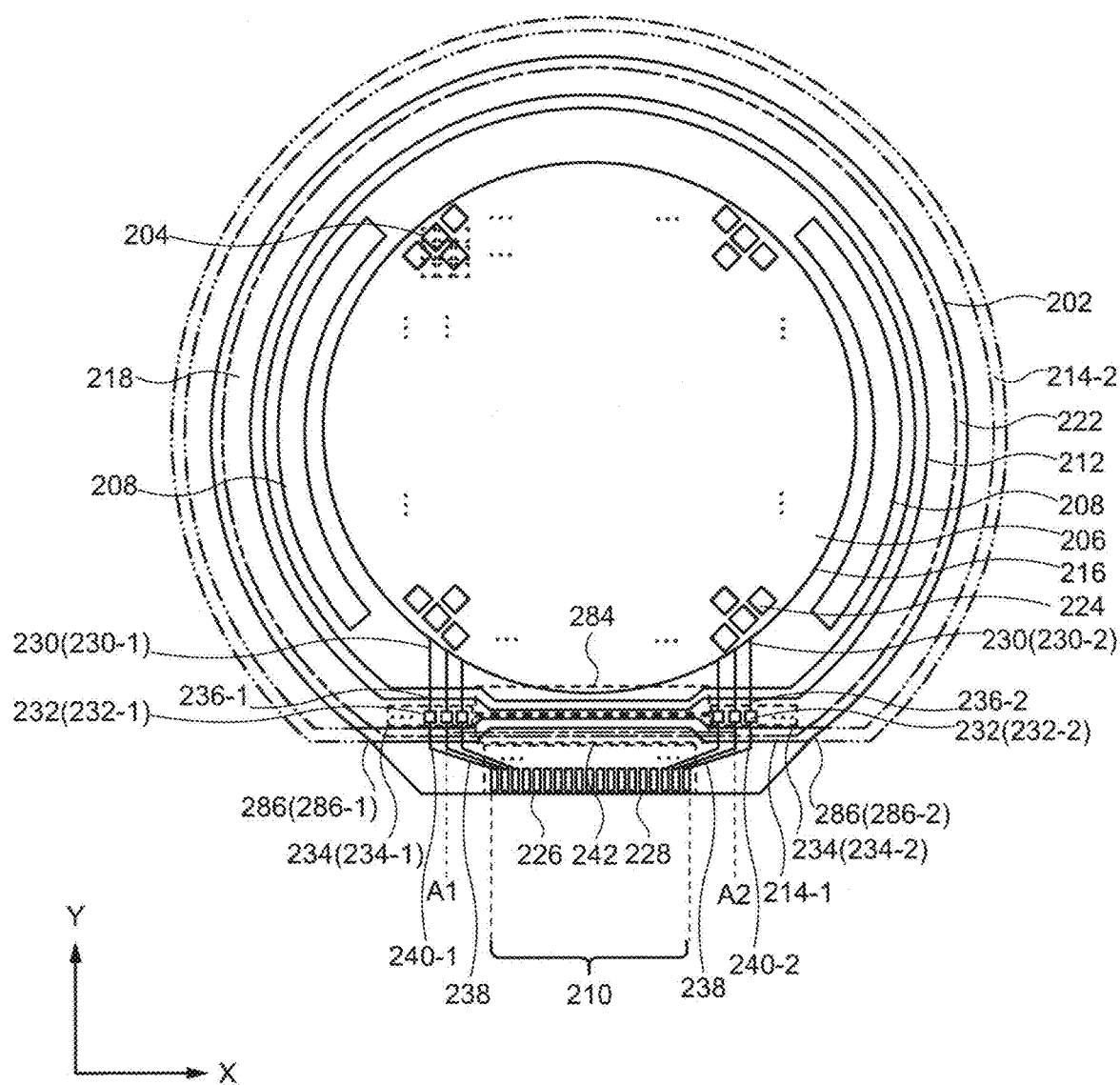
FIG. 11 is a schematic top view of a display device according to an embodiment of the present invention.

The first dam 212 having a convex portion 284 may be arranged in a display device 200b. The first dam 212 may have the convex portion 284 toward the outer shape of the substrate 202 at the periphery of the contact portion 234. Specifically, as shown in FIG. 11, the first dam 212 has the convex portion 284 between the second dam 214-1 and a display area 216. If the display area 216 as shown in FIG. 11 is circular, the display area 216 can be made wider because it is possible to secure a wider space between the first dam 212, and the display device 200b can be made with a narrowed frame.

2-2. Modification 2

Figure 12:
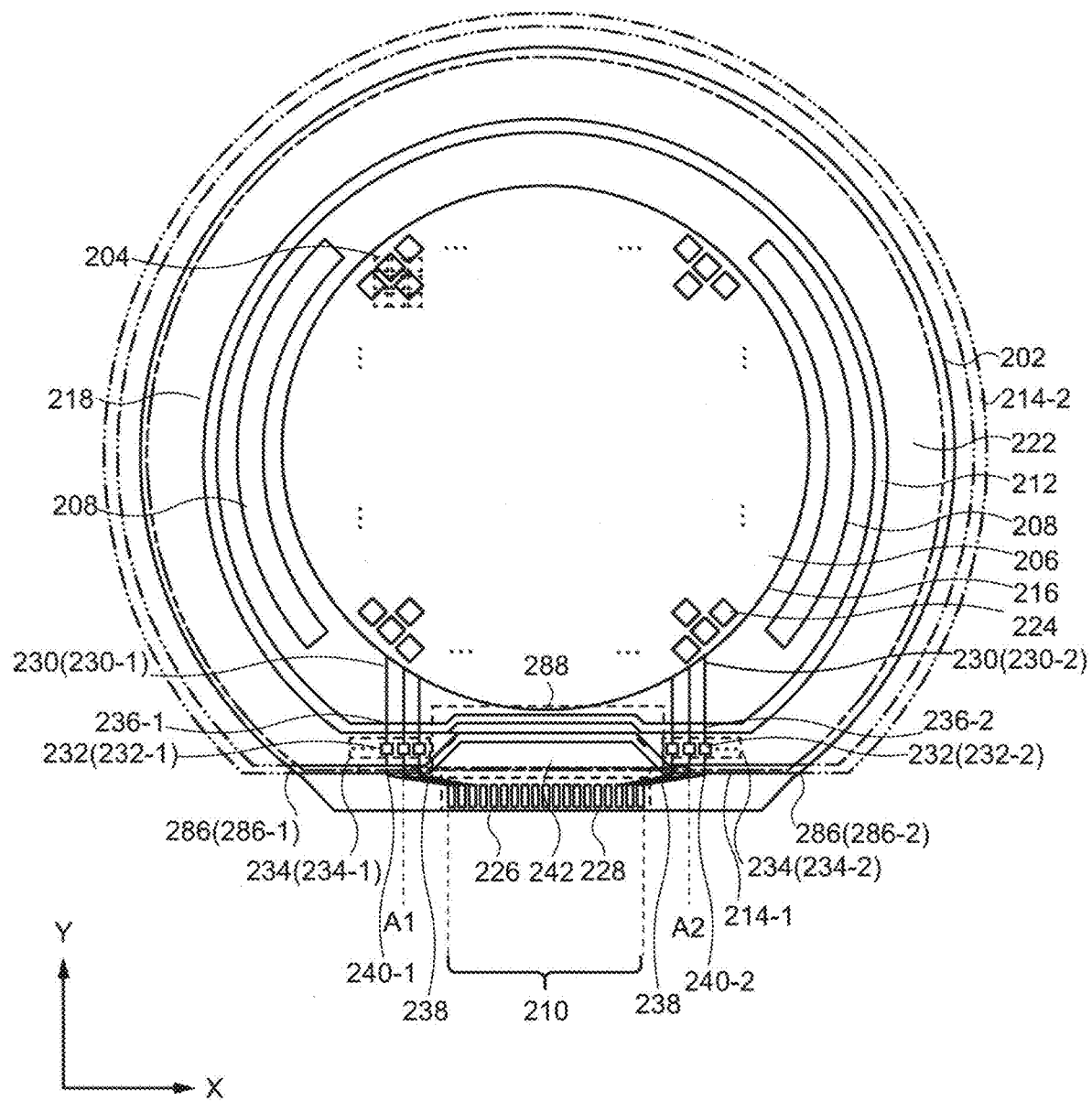
FIG. 12 is a schematic top view of a display device according to an embodiment of the present invention.

The first dam 212 having a concave portion 288 may be arranged in a display device 200c. As shown in FIG. 12, the concave portion 288 toward the display area 216 may be arranged in the first dam 212. As shown in FIG. 12, the first dam 212 has the concave portion 288 between the second dam 214-1 and the display area 216. Since the first dam 212 and the second dam 214 have the concave portion 288 and the concave portion 242 between the mounting pad 210 and the display area 216, the mounting pad 210 can be arranged closer to the display area 216 than in the display device 200b.

3. Modification of Product Outer Shape

In the following description, a modification of the outer shape of the substrate 202 is shown as a product outer shape of a display device 200d.

3-1. Modification 1

Figure 13:
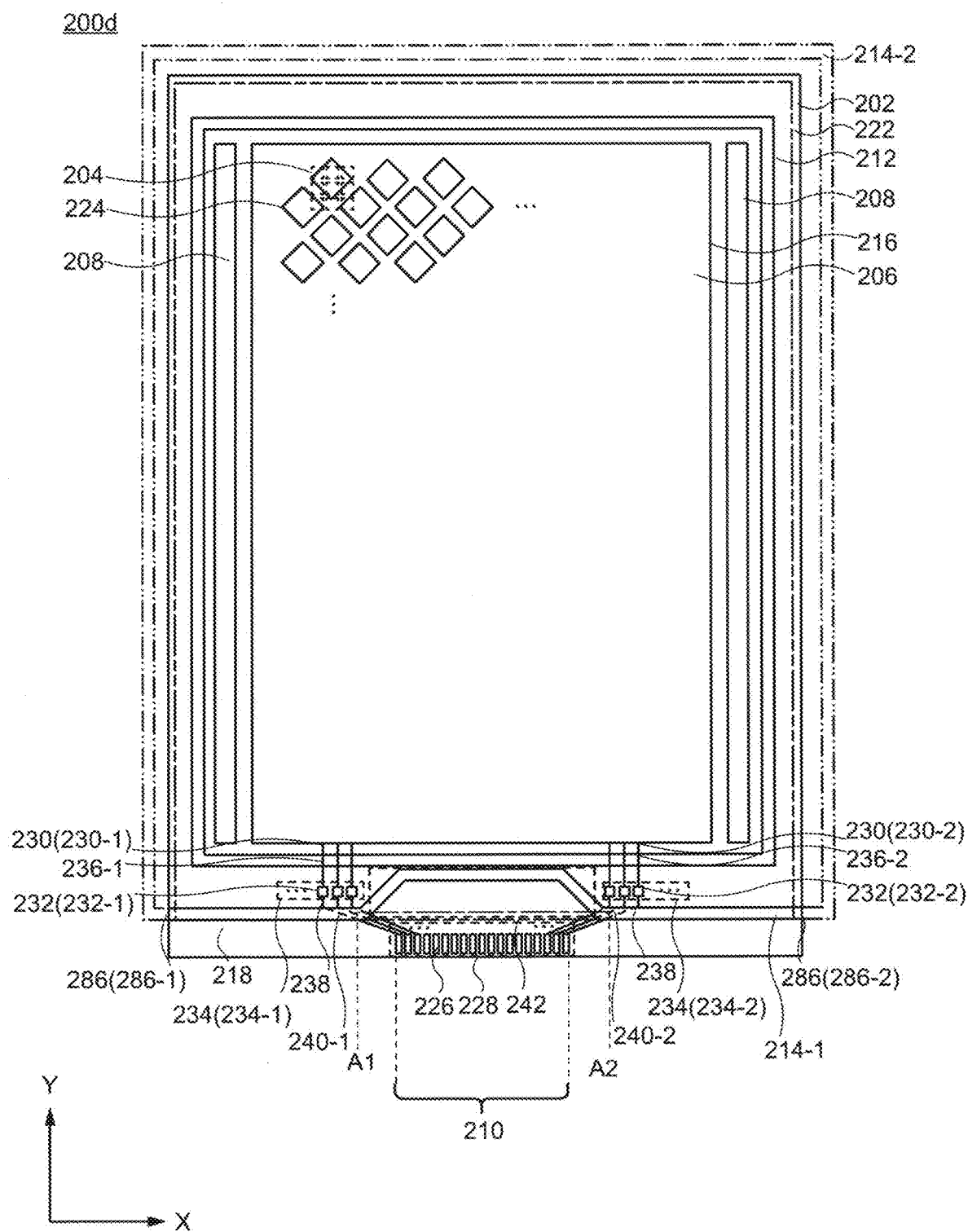
FIG. 13 is a schematic top view of a display device according to an embodiment of the present invention.

The display device 200d may have a polygonal substrate 202. FIG. 13 shows an example in which the substrate 202 of the display device 200d or the product outer shape is a rectangle. If the substrate 202 or the product outer shape is a rectangle, when manufacturing the plurality of display devices 200d on one substrate, a space between the adjacent display devices 200d can be used efficiently.

As shown in FIG. 13, the outer shape of the first dam 212 is polygonal similar to the substrate 202. In addition, if the outer shape of the second dam 214-2 is a shape along the outer shape of the substrate 202, when manufacturing a plurality of display devices 200d on one substrate, a space between the adjacent display devices 200d can be used efficiently. In particular, as shown in FIG. 13, if the second dam 214-2 is a rectangle, it is possible to use the space between the adjacent display devices 200d more efficiently.

Figure 14:
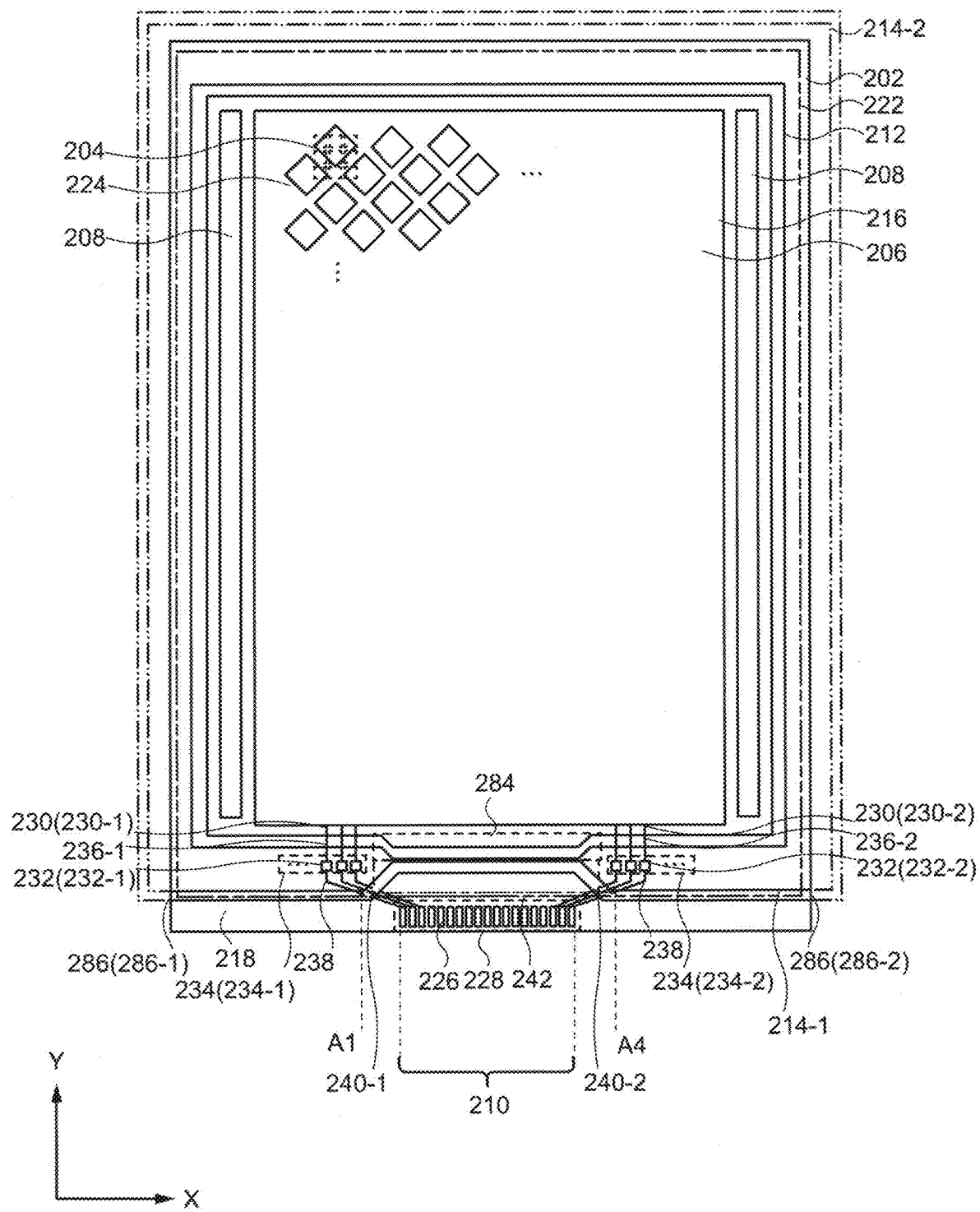
FIG. 14 is a schematic top view of a display device according to an embodiment of the present invention.

Next, as shown in FIG. 14, an example in which the first dam 212 includes the convex portion 284 toward the second dam 214 between the display area 216 and the concave portion 242 of the second dam 214 is shown.

In FIG. 13 and FIG. 14, although an example in which the display area 216 has a shape along the outer shape of the substrate 202 is shown, the shape of the display area 216 may not be the shape along the outer shape of the substrate 202. For example, the display area 216 in FIG. 13 may be circular as shown in FIG. 1.

The display device 200 includes the first dam 212 surrounding the display area 216, the second dam 214-1 arranged between the outer shape of the substrate 202 and the first dam 212, and the second dam 214-2 surrounding the outer shape of the substrate 202. The second dam 214-1 has the concave portion 242 toward the first dam 212 between the mounting pad 210 and the first dam, and the concave portion 242 is arranged between the mounting pad 210 and the first dam. The second dam 214-2 is arranged outside the outer shape of the substrate 202. With such an arrangement, the mounting pad 210 can be arranged proximate to the display area 216 while ensuring a certain distance from the second dam 214, and the contact portion 234 can be arranged proximate to the display area 216 while maintaining a certain distance between the first dam 212 and the second dam 214. Further, since the second dam 214-2 is arranged outside the outer shape of the substrate 202, the first dam 212 may be arranged closer to the outer shape of the substrate 202. The closer arrangement of the first dam 212 creates a space between the first dam 212 and the display area 216. Arranging a driving circuit 208 located between the first dam 212 and the display area 216 in this space makes it possible to widen the display area 216.

Therefore, applying the present embodiment makes it possible to arrange the structures such as the mounting pad 210, the contact portion 234, and the driving circuit 208 efficiently in the surrounding area 118 of the display device 200, the display area 216 can occupy a wider area on the substrate 202, and it is possible to provide the display device 200 with a narrowed frame.

Each embodiment described above as embodiments of the present invention can be implemented in combination as appropriate as long as they do not contradict each other. In addition, those skilled in the art could appropriately add, delete or change the design of the constituent elements based on the display device of each embodiment, or add, omit or change conditions as long as it does not depart from the concept of the present invention and such changes are included within the scope of the present invention.

Further, it is understood that, even if the effect is different from those provided by each of the above-described embodiments, the effect obvious from the description in the specification or easily predicted by persons ordinarily skilled in the art is apparently derived from the present invention.

What is claimed is:

1. A display device comprising:
    a display area;
    a first dam surrounding the display area;
    a second dam surrounding the first dam;
    a first sensor electrode and a second sensor electrode overlapping the display area;
    a first sensor wiring over the first dam and electrically connected to the first sensor electrode;
    a second sensor wiring over the first dam and electrically connected to the second sensor electrode;
    a first wiring under the second dam and electrically connected to the first sensor wiring at a first contact portion; and
    a second wiring under the second dam and electrically connected to the second sensor wiring at a second contact portion, wherein
    the first contact portion and the second contact portion are located between the first dam and the second dam,
    the second dam has an overlap with the first wiring at a first overlap portion,
    the second dam has an overlap with the second wiring at a second overlap portion,
    the second dam has a second intermediate portion between the first overlap portion and the second overlap portion,
    the first dam has an overlap with the first sensor wiring at a third overlap portion,
    the first dam has an overlap with the second sensor wiring at a fourth overlap portion,
    the first dam has a first intermediate portion between the third overlap portion and the fourth overlap portion, and
    a third length between the first intermediate portion of the first dam and the second intermediate portion of the second dam is shorter than a first length between the first overlap portion of the second dam and the third overlap portion of the first dam and a second length between the second overlap portion of the second dam and the fourth overlap portion of the first dam.

2. The display device according to claim 1,
    wherein the second intermediate portion of the second dam has a concave shape concaving toward the display area in a plan view.

3. The display device according to claim 1,
    wherein the first intermediate portion of the first dam has a convex shape protruding toward the second dam in the plan view.

4. The display device according to claim 1,
    wherein an outer shape of the first dam is a polygon.

5. The display device according to claim 1,
    wherein an outer shape of the first dam has an arc-shaped part.

6. A display device comprising:
    a display area;
    a first dam surrounding the display area;
    a second dam surrounding the display area and having cut surfaces at both ends;
    a first sensor electrode and a second sensor electrode overlapping the display area;
    a first sensor wiring over the first dam and electrically connected to the first sensor electrode;
    a second sensor wiring over the first dam and electrically connected to the second sensor electrode;
    a first wiring under the second dam and electrically connected to the first sensor wiring at a first contact portion; and
    a second wiring under the second dam and electrically connected to the second sensor wiring at a second contact portion, wherein
    the first contact portion and the second contact portion are located between the first dam and the second dam,
    the second dam has an overlap with the first wiring at a first overlap portion,
    the second dam has an overlap with the second wiring at a second overlap portion,
    the second dam has a second intermediate portion between the first overlap portion and the second overlap portion,
    the first dam has an overlap with the first sensor wiring at a third overlap portion,
    the first dam has an overlap with the second sensor wiring at a fourth overlap portion,
    the first dam has a first intermediate portion between the third overlap portion and the fourth overlap portion, and
    a third length between the first intermediate portion of the first dam and the second intermediate portion of the second dam is shorter than a first length between the first overlap portion of the second dam and the third overlap portion of the first dam and a second length between the second overlap portion of the second dam and the fourth overlap portion of the first dam.

7. The display device according to claim 6,
    wherein the second intermediate portion of the second dam has a concave shape concaving toward the display area in a plan view.

8. The display device according to claim 6,
wherein the first intermediate portion of the first dam has a convex shape protruding toward the second dam in the plan view.

9. The display device according to claim 6,
wherein an outer shape of the first dam is a polygon.

10. The display device according to claim 6,
wherein an outer shape of the first dam has an arc-shaped part.

11. The display device according to claim 6 further comprising:
an overcoat layer over the first sensor electrode,
wherein a cut surface of the overcoat layer is flush with the cut surface of the second dam.

* * * * *